United States Patent
Lin et al.

(10) Patent No.: US 9,508,621 B2
(45) Date of Patent: *Nov. 29, 2016

(54) SEMICONDUCTOR DEVICE AND METHOD OF FORMING COMPLIANT STRESS RELIEF BUFFER AROUND LARGE ARRAY WLCSP

(71) Applicant: STATS ChipPAC, Ltd., Singapore (SG)

(72) Inventors: Yaojian Lin, Singapore (SG); Il Kwon Shim, Singapore (SG); Seng Guan Chow, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/564,427

(22) Filed: Dec. 9, 2014

(65) Prior Publication Data

US 2015/0145126 A1 May 28, 2015

Related U.S. Application Data

(60) Continuation of application No. 13/231,789, filed on Sep. 13, 2011, now Pat. No. 8,912,648, which is a division of application No. 12/625,975, filed on Nov. 25, 2009, now Pat. No. 8,034,661.

(51) Int. Cl.
   *H01L 23/31* (2006.01)
   *H01L 21/56* (2006.01)
   (Continued)

(52) U.S. Cl.
   CPC ............ *H01L 23/3128* (2013.01); *H01L 21/56* (2013.01); *H01L 21/568* (2013.01); *H01L 21/6835* (2013.01); *H01L 23/16* (2013.01);
   (Continued)

(58) Field of Classification Search
   CPC .......... H01L 2924/01079; H01L 2924/01029; H01L 2924/01078; H01L 2224/48091; H01L 2224/48247
   USPC .......... 438/108, 110, 112; 257/678, 711, 730
   See application file for complete search history.

(56) References Cited

U.S. PATENT DOCUMENTS 5,250,843 A 10/1993 Eichelberger
5,353,498 A 10/1994 Fillion et al.
(Continued)

FOREIGN PATENT DOCUMENTS

CN 1158006 A 8/1997
CN 1996575 A 7/2007

*Primary Examiner* — Quoc Hoang
(74) *Attorney, Agent, or Firm* — Robert D. Atkins; Patent Law Group: Atkins and Associates, P.C.

(57) ABSTRACT

A semiconductor device has a stress relief buffer mounted to a temporary substrate in locations designated for bump formation. The stress relief buffer can be a multi-layer composite material such as a first compliant layer, a silicon layer formed over the first compliant layer, and a second compliant layer formed over the silicon layer. A semiconductor die is also mounted to the temporary substrate. The stress relief buffer can be thinner than the semiconductor die. An encapsulant is deposited between the semiconductor die and stress relief buffer. The temporary substrate is removed. An interconnect structure is formed over the semiconductor die, encapsulant, and stress relief buffer. The interconnect structure is electrically connected to the semiconductor die. A stiffener layer can be formed over the stress relief buffer and encapsulant. A circuit layer containing active devices, passive devices, conductive layers, and dielectric layers can be formed within the stress relief buffer.

25 Claims, 9 Drawing Sheets

(51) Int. Cl.
*H01L 21/683* (2006.01)
*H01L 23/16* (2006.01)
*H01L 23/552* (2006.01)
*H01L 23/00* (2006.01)

(52) U.S. Cl.
CPC ......... *H01L 23/3121* (2013.01); *H01L 23/552* (2013.01); *H01L 24/11* (2013.01); *H01L 24/19* (2013.01); *H01L 24/20* (2013.01); *H01L 24/97* (2013.01); *H01L 24/48* (2013.01); *H01L 2224/0401* (2013.01); *H01L 2224/04105* (2013.01); *H01L 2224/12105* (2013.01); *H01L 2224/16225* (2013.01); *H01L 2224/20* (2013.01); *H01L 2224/32245* (2013.01); *H01L 2224/48091* (2013.01); *H01L 2224/73265* (2013.01); *H01L 2224/73267* (2013.01); *H01L 2224/97* (2013.01); *H01L 2924/014* (2013.01); *H01L 2924/01004* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01073* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/15174* (2013.01); *H01L 2924/15311* (2013.01); *H01L 2924/181* (2013.01); *H01L 2924/19041* (2013.01); *H01L 2924/19105* (2013.01); *H01L 2924/3025* (2013.01); *H01L 2924/30105* (2013.01); *H01L 2924/3511* (2013.01)

(56) References Cited

U.S. PATENT DOCUMENTS

| | | | |
|---|---|---|---|
| 5,533,256 | A | 7/1996 | Call et al. |
| 5,835,355 | A | 11/1998 | Dordi |
| 5,841,193 | A | 11/1998 | Eichelberger |
| 5,866,952 | A | 2/1999 | Wojnarowski et al. |
| 6,011,304 | A | 1/2000 | Mertol |
| 7,015,577 | B2 | 3/2006 | Wang |
| 7,432,601 | B2 | 10/2008 | Chen |
| 7,445,957 | B2 * | 11/2008 | Huang ............... H01L 21/6835 257/E21.494 |
| 7,619,901 | B2 | 11/2009 | Eichelberger et al. |
| 7,745,260 | B2 | 6/2010 | Lo |
| 7,868,446 | B2 * | 1/2011 | Meyer ................... H01L 21/561 257/693 |
| 8,013,438 | B2 | 9/2011 | Luan et al. |
| 8,021,930 | B2 | 9/2011 | Pagaila |
| 8,034,661 | B2 * | 10/2011 | Lin ....... H01L 21/568 257/E21.503 |
| 8,912,648 | B2 * | 12/2014 | Lin ....... H01L 21/568 257/730 |
| 2007/0278671 | A1 | 12/2007 | Fan |
| 2008/0083992 | A1 | 4/2008 | Lin et al. |
| 2008/0093748 | A1 | 4/2008 | Chen |
| 2008/0237855 | A1 | 10/2008 | Fan et al. |
| 2009/0065927 | A1 | 3/2009 | Meyer |
| 2009/0096093 | A1 | 4/2009 | Yang et al. |
| 2009/0108440 | A1 | 4/2009 | Meyer et al. |
| 2010/0035384 | A1 | 2/2010 | Eichelberger et al. |

* cited by examiner

US 9,508,621 B2

SEMICONDUCTOR DEVICE AND METHOD OF FORMING COMPLIANT STRESS RELIEF BUFFER AROUND LARGE ARRAY WLCSP

CLAIM OF DOMESTIC PRIORITY

The present application is a continuation of U.S. patent application Ser. No. 13/231,789, now U.S. Pat. No. 8,912,648, filed Sep. 13, 2011, which is a division of U.S. patent application Ser. No. 12/625,975, now U.S. Pat. No. 8,034,661, filed Nov. 25, 2009, which applications are incorporated herein by reference.

FIELD OF THE INVENTION

The present invention relates in general to semiconductor devices and, more particularly, to a semiconductor device and method of forming a compliant stress relief buffer around a large array WLCSP and FO-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

WLCSP and FO-WLCSP often contain large array semiconductor die that redistribute signal paths from fine pitch bonding pads of the die to the periphery fan-out area for higher functional integration to external devices. The large array WLCSP are known to experience reliability problems, in particular with solder joint failures during temperature cycling and drop impact testing. In addition, the large array WLCSPs tend to have a warpage issue due to the large die size.

SUMMARY OF THE INVENTION

A need exists to reduce solder joint failure in large array WLCSP and FO-WLCSP. Accordingly, in one embodiment, the present invention is a method of making a semiconductor device comprising the step of providing a semiconductor die or component including an electrical functionality and a mechanical functionality, disposing a stress relief buffer including a compliant material around the semiconductor die or component, and depositing an encapsulant around the semiconductor die or component and stress relief buffer.

In another embodiment, the present invention is a method of making a semiconductor device comprising the steps of providing a semiconductor die or component including an electrical functionality and a mechanical functionality and disposing a stress relief buffer including a compliant material adjacent to the semiconductor die or component.

In another embodiment, the present invention is a semiconductor device comprising a semiconductor die or component including an electrical functionality and a mechanical functionality. A stress relief buffer including a compliant material is disposed around the semiconductor die or component. An encapsulant is deposited around the semiconductor die or component and stress relief buffer.

In another embodiment, the present invention is a semiconductor device comprising a semiconductor die or component including an electrical functionality and a mechanical functionality. A stress relief buffer including a compliant material is disposed adjacent to the semiconductor die or component.

DETAILED DESCRIPTION OF THE DRAWINGS

Figure 1:
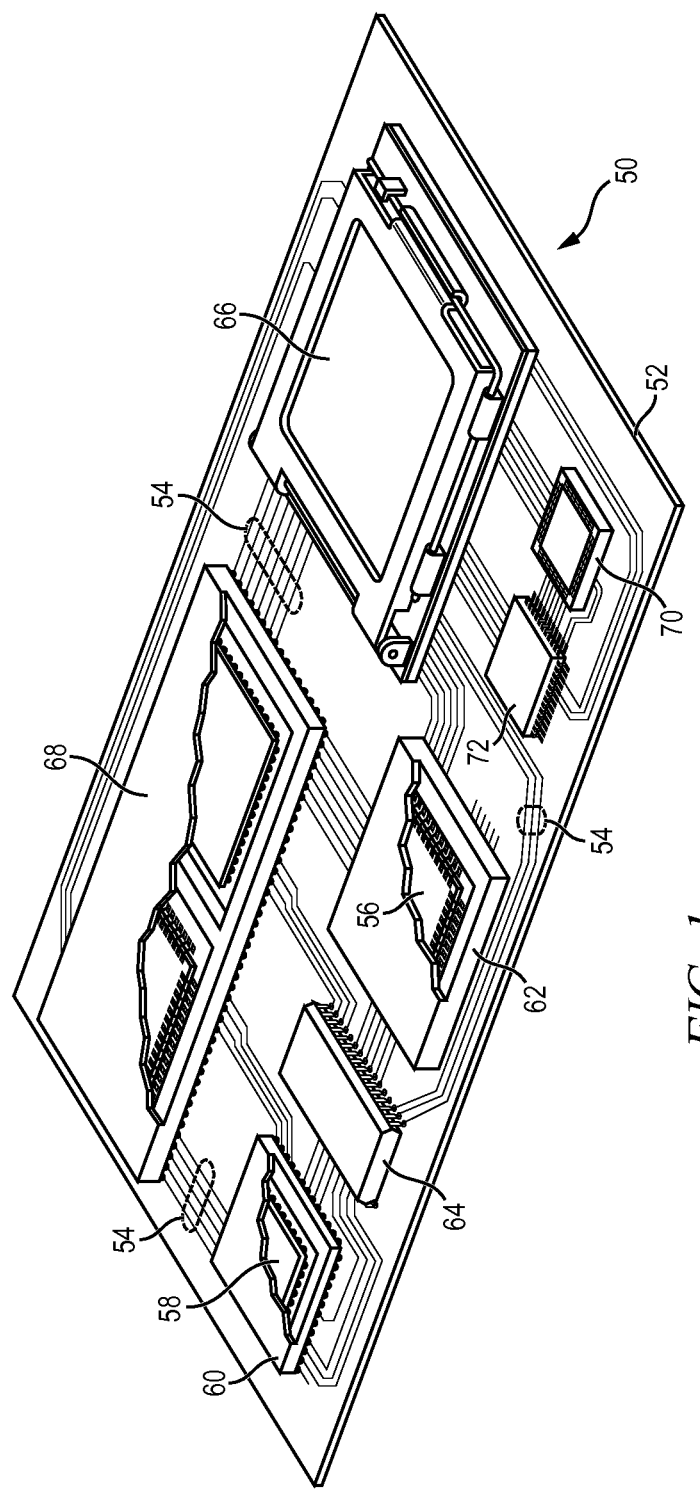
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
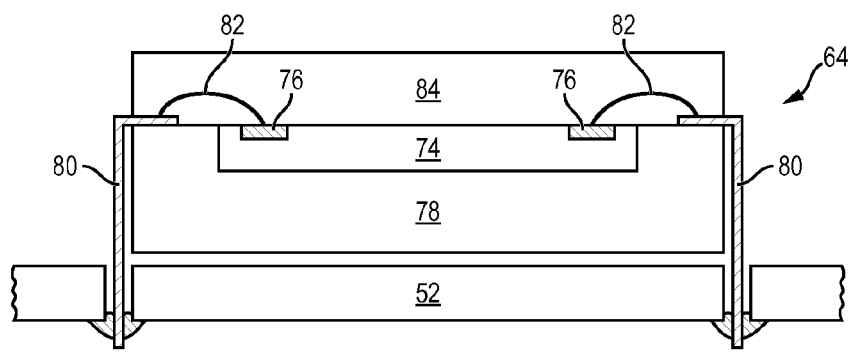
FIGS. 2a-2c illustrate further detail of the representative semiconductor packages mounted to the PCB.
Figure 2B:
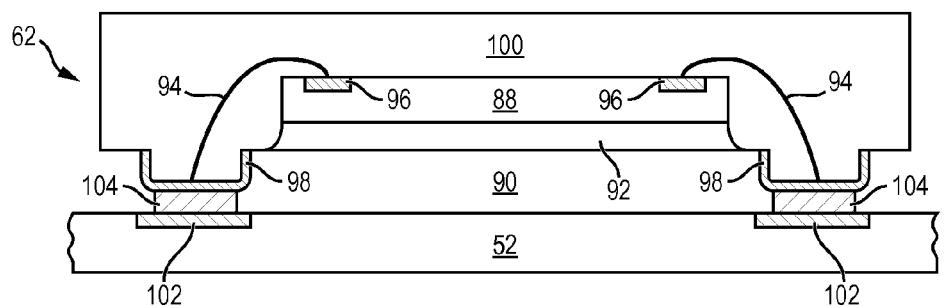
Figure 2C:
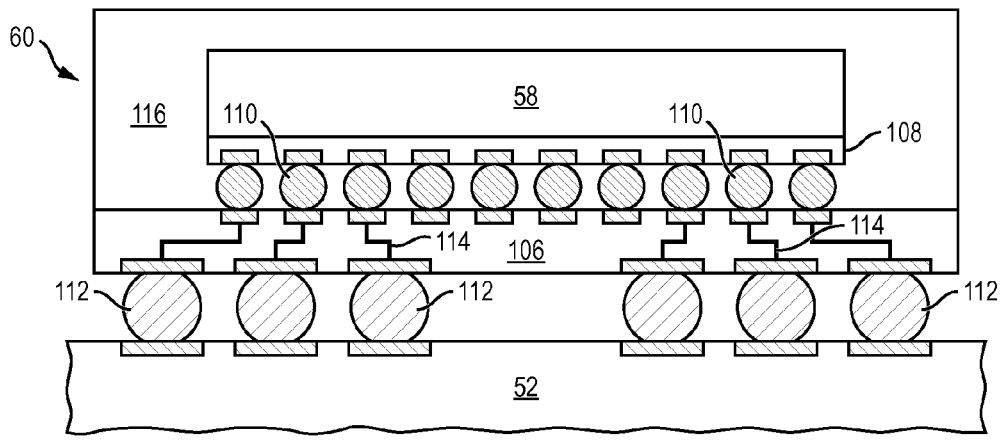

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
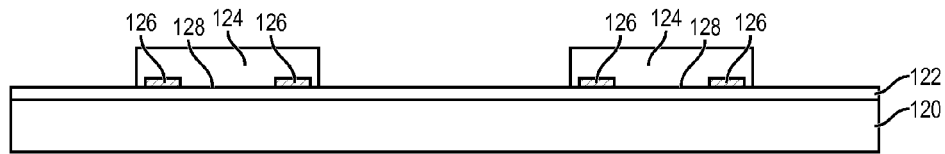
FIGS. 3a-3f illustrate a process of forming a compliant stress relief buffer around a semiconductor die.

FIGS. 3a-3f illustrate, in relation to FIGS. 1 and 2a-2c, a process of forming compliant stress relief buffer around a semiconductor die. In FIG. 3a, a substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. An optional interface layer 122 can be formed over carrier 120 as a temporary adhesive bonding film or etch-stop layer.

Semiconductor die or components 124 are mounted to interface layer 122 with contact pads 126 on active surface 128 oriented downward toward carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

Figure 3B:
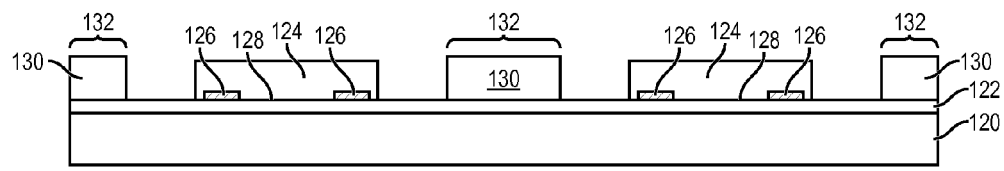

In FIG. 3b, a compliant stress relief buffer or block structure 130 is pre-formed as circular or square patches, or rectangular strips using a molding process. Stress relief buffer 130 contains compliant material, such as polymer, epoxy, polymeric material, epoxy resin with filler, or epoxy acrylate with filler. Alternatively, stress relief buffer 130 can be polytetrafluoroethylene pre-impregnated (prepreg) with a combination of phenolic cotton paper, epoxy, resin, woven glass, matte glass, polyester, and other reinforcement fibers or fabrics, PCB board material with core layer, or other damping material. Stress relief buffer 130 is mounted to interface layer 122 in locations 132 designated for bump formation, i.e., at the edges or corners of the completed FO-WLCSP.

Figure 3C:
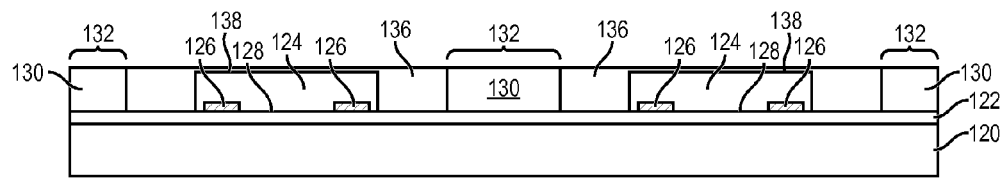

In FIG. 3c, an encapsulant or molding compound 136 is deposited between stress relief buffer 130 and semiconductor die 124 and over the semiconductor die to a level even with the stress relief buffer using a paste printing, compressive molding, transfer molding, liquid encapsulant molding, vacuum lamination, spin coating, or other suitable applicator. Stress relief buffer 130 can be thicker than semiconductor die 124 so encapsulant 136 covers back surface 138 of the die. Encapsulant 136 can be polymer composite material, such as epoxy resin with filler, epoxy acrylate with filler, or polymer with proper filler. Encapsulant 136 is non-conductive and environmentally protects the semiconductor device from external elements and contaminants.

Figure 3D:
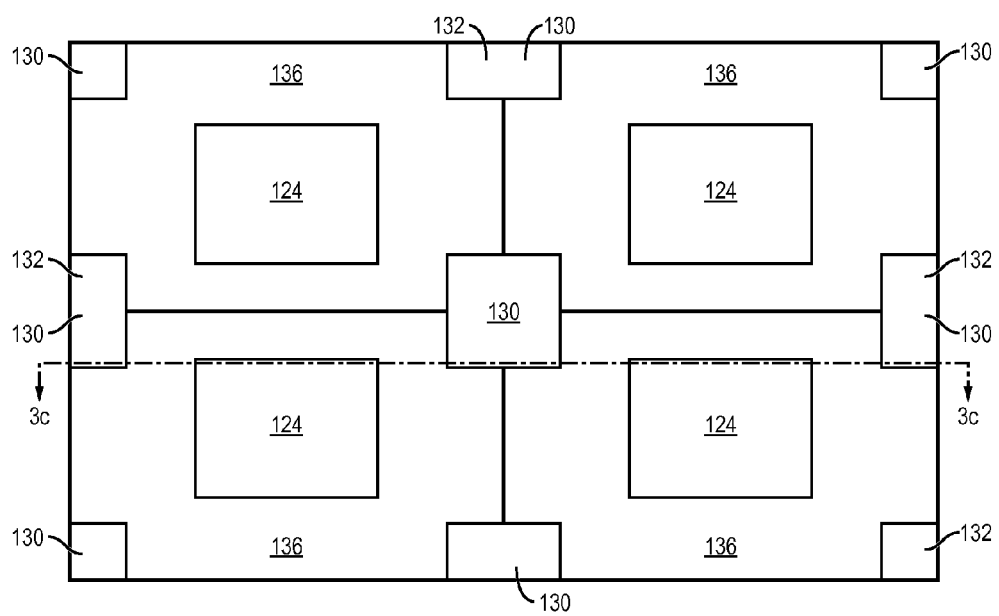

FIG. 3d shows a top view of a grouping of four semiconductor die 124, stress relief buffer 130, and encapsulant 136 over carrier 120. Stress relief buffer 130 is mounted to locations 132 designated for bump formation at the edges and corners of the FO-WLCSP.

Figure 3E:
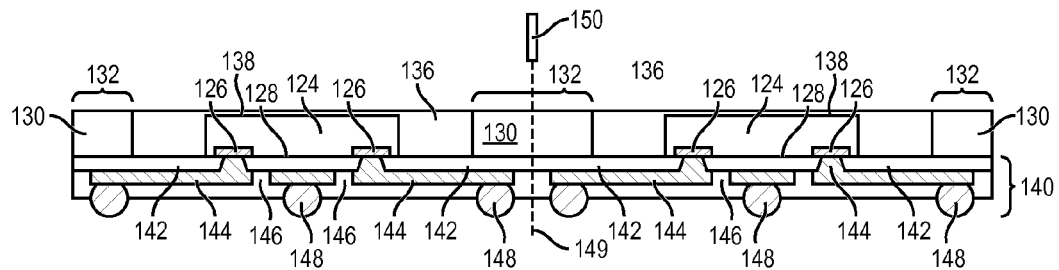

In FIG. 3e, temporary carrier 120 and optional interface layer 122 are removed by chemical etching, mechanical peel-off, CMP, mechanical grinding, thermal bake, laser scanning, or wet stripping. A bottom-side build-up interconnect structure 140 is formed over semiconductor die 124, stress relief buffer 130, and encapsulant 136. The build-up interconnect structure 140 includes an insulating or passivation layer 142 containing one or more layers of silicon dioxide (SiO2), silicon nitride (Si3N4), silicon oxynitride (SiON), tantalum pentoxide (Ta2O5), aluminum oxide (Al2O3), low temperature (250° C.) cured polymer photoresist, such as benzocyclobutene (BCB), polybenzoxazoles (PBO), epoxy based photosensitive polymer dielectric, or other material having similar insulating and structural properties. The insulating layer 142 is formed using PVD, CVD, printing, spin coating, spray coating, sintering or thermal oxidation. A portion of insulating layer 142 is removed by an etching process to expose contact pads 126 of semiconductor die 124.

An electrically conductive layer 144 is formed over insulating layer 142 and contact pads 126 using a patterning and metal deposition process such as PVD, CVD, sputtering, electrolytic plating, and electroless plating. Conductive layer 144 can be one or more layers of Al, Cu, Ti, TiW, Sn, Ni, Au, Ag, or other suitable electrically conductive material. Conductive layer 144 operates as a redistribution layer (RDL). One portion of conductive layer 144 is electrically connected to contact pads 126 of semiconductor die 124. Other portions of conductive layer 144 can be electrically common or electrically isolated depending on the design and function of the semiconductor device.

An insulating or passivation layer 146 is formed over insulating layer 142 and conductive layer 144 using PVD, CVD, printing, spin coating, spray coating, sintering or thermal oxidation. The insulating layer 146 can be one or more layers of SiO2, Si3N4, SiON, Ta2O5, Al2O3, low temperature (250° C.) cured polymer photoresist, such as BCB, PBO, or epoxy based photosensitive polymer dielectric, or other material having similar insulating and structural properties. A portion of insulating layer 146 is removed by an etching process to expose conductive layer 144.

An electrically conductive bump material is deposited over build-up interconnect structure 140 and electrically connected to conductive layer 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. The bumps can also be compression bonded to conductive layer 144. Bumps 148 represent one type of interconnect structure that can be formed over conductive layer 144. The interconnect structure can also use bond wires, stud bump, micro bump, or other electrical interconnect.

Figure 3F:
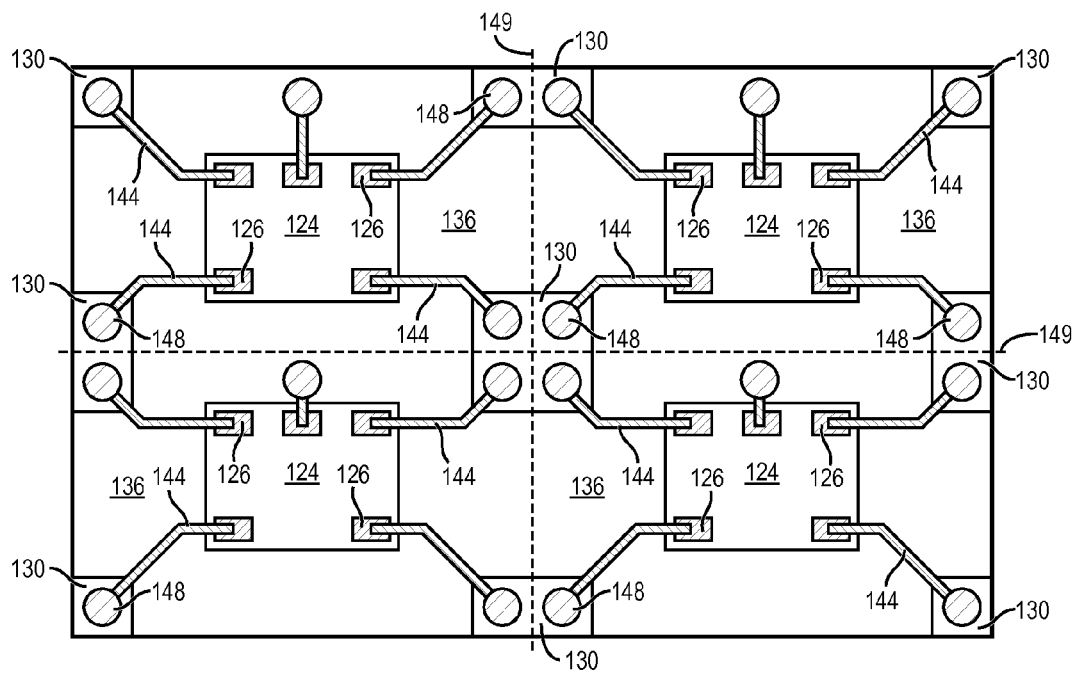

FIG. 3f shows a top view of a grouping of four semiconductor die 124, stress relief buffer 130, and encapsulant 136 with contact pads 126 electrically connected to bumps 148 through conductive layer 144.

Figure 4:
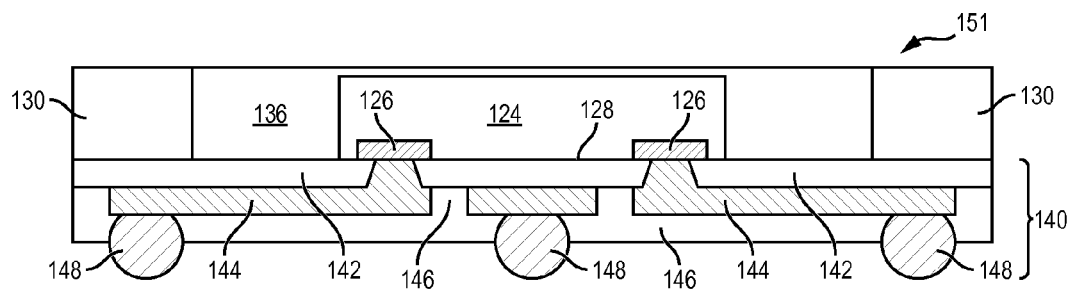
FIG. 4 illustrates a FO-WLCSP with the stress relief buffer around the semiconductor die.

The final semiconductor package, including semiconductor die 124, encapsulant compound 136, stress relief buffer 130, and interconnect structure 140, is singulated along lines 149 with saw blade or laser cutting device 150 in FIGS. 3e and 3f into individual semiconductor devices. FIG. 4 shows FO-WLCSP 151 after singulation. Semiconductor die 124 is electrically connected to bottom-side build-up interconnect structure 140 and bumps 148. The pre-formed compliant stress relief buffer 130 is disposed around edges, corners, and other package integrity critical regions of FO-WLCSP 151 to prevent failure of bumps 148 during temperature cycling testing and other mechanical shock or impact of a reliability or drop test by absorbing thermo-mechanical stress. Stress relief buffer 130 has a low Young's modulus, i.e., less than encapsulant 136, good elasticity and resiliency characteristics, and coefficient of thermal expansion (CTE) similar to or slightly less than the encapsulant. Stress relief buffer 130 also serves to reduce die shifting during the encapsulation process.

Figure 5A:
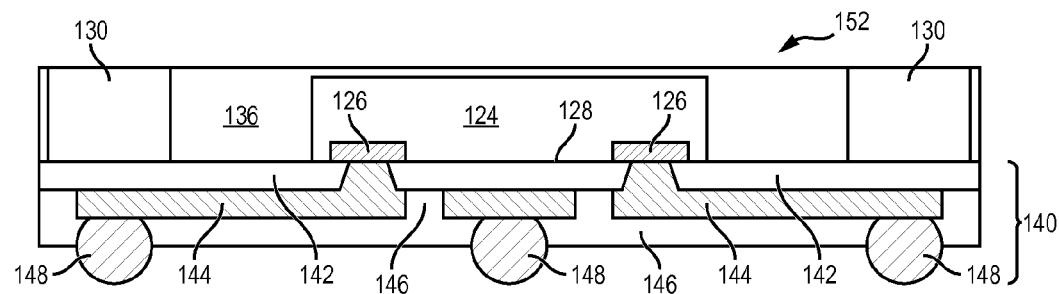
FIGS. 5a-5b illustrate the stress relief buffer extending partially or completely along a side of the FO-WLCSP.
Figure 5B:
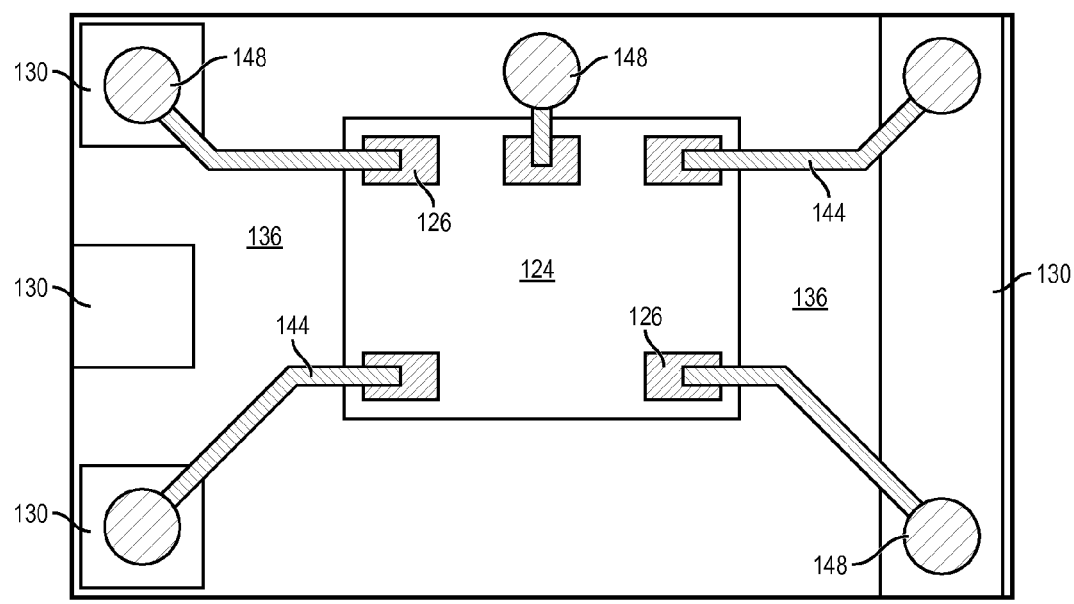

FIGS. 5a and 5b show a cross-sectional and top view of pre-formed compliant stress relief buffer 130 extending partially or completely along a side of FO-WLCSP 152.

Figure 6:
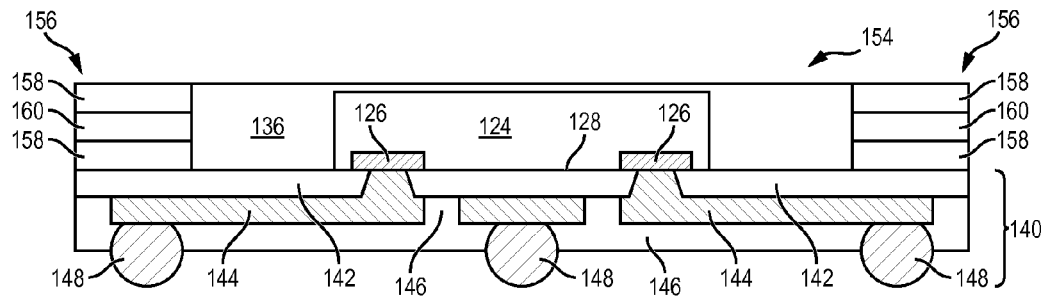
FIG. 6 illustrates a multi-layer composite stress relief buffer.

FIG. 6 shows an embodiment of FO-WLCSP 154, similar to the structure described in FIGS. 3a-3f, with pre-formed composite stress relief buffer 156 containing multiple layers. In one embodiment, composite stress relief buffer 156 has a compliant material layer 158, silicon layer 160, and compliant material layer 158. Alternatively, the layers of composite stress relief buffer 156 are metal/compliant material/metal, or silicon/compliant material/silicon. Composite stress relief buffer 156 reduces warpage in FO-WLCSP 154. By reducing warpage and CTE-induced stress, FO-WLCSP 154 has reduced solder joint failure, particularly around the periphery of the semiconductor die.

Figure 7:
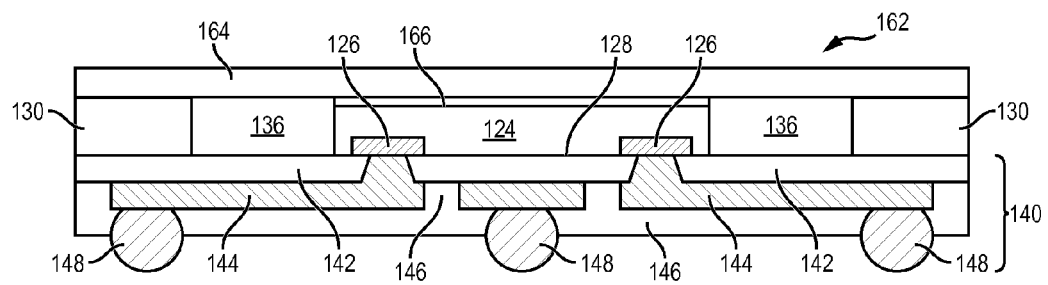
FIG. 7 illustrates a stiffener mounted over the stress relief buffer and semiconductor die.

FIG. 7 shows an embodiment of FO-WLCSP 162, similar to the structure described in FIGS. 3a-3f, with metal stiffener or layer 164 mounted over stress relief buffer 130 and encapsulant 136. An adhesive layer is deposited over stress relief buffer 130 to secure stiffener 164. Stiffener 164 reduces warpage in FO-WLCSP 162. Stiffener 164 can be used as a heat sink with an optional thermal interface material (TIM) 166 for heat dissipation from semiconductor die 124. As a heat sink, stiffener 164 can be Al, Cu, or another material with high thermal conductivity. TIM 166 aids in the distribution and dissipation of heat generated by semiconductor die 124. Stiffener 164 can also operate as an electromagnetic interference (EMI) or radio frequency interference (RFI) shielding layer. As an EMI or RFI shielding layer, stiffener 164 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. The shielding layer can also be a non-metal material such as carbon-black or aluminum flake to reduce the effects of EMI and RFI. Stiffener 164 can be grounded to divert the EMI and RFI signals.

Figure 8:
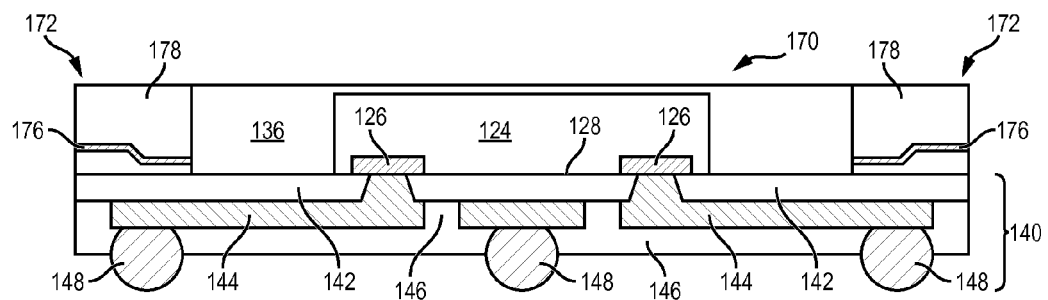
FIG. 8 illustrates a circuit layer formed in the stress relief buffer.

FIG. 8 shows an embodiment of FO-WLCSP 170, similar to the structure described in FIGS. 3a-3f, with pre-formed stress relief buffer 172 containing circuit layers 176 embedded within compliant stress relief material 178. Circuit layers 176 may contain analog or digital circuits implemented as active devices, passive devices, conductive layers, and dielectric layers formed within stress relief material 178.

Figure 9A:
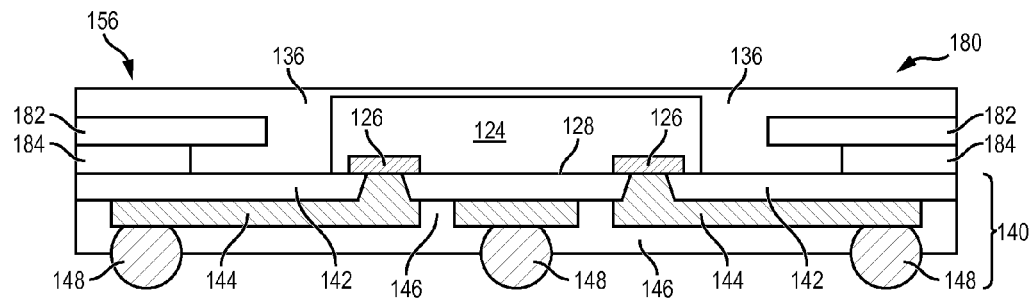
FIGS. 9a-9b illustrate a stiffener formed over a stress relief buffer that is thinner than the semiconductor die.
Figure 9B:
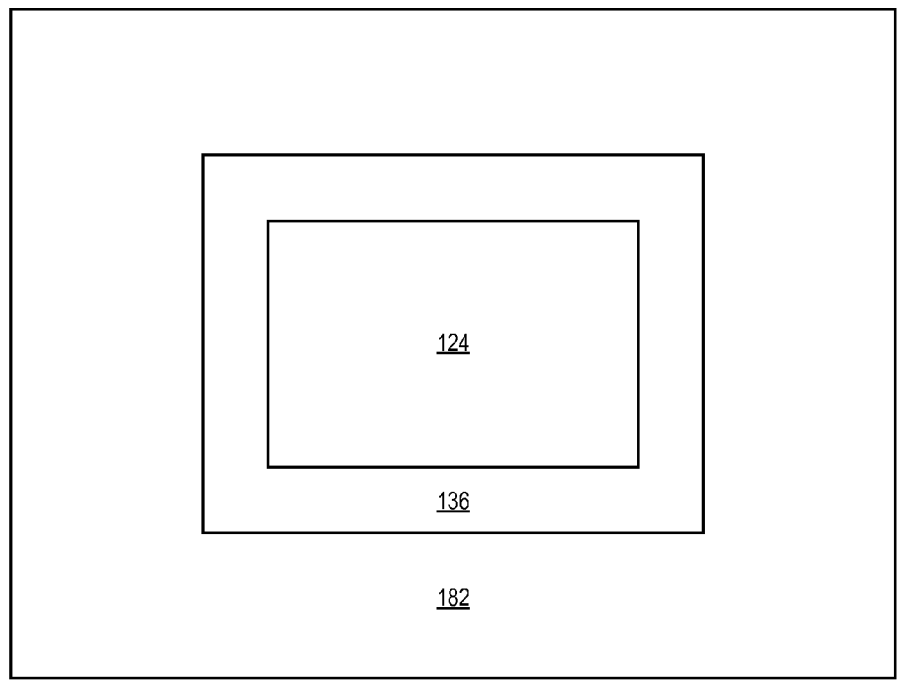

FIG. 9a shows an embodiment of FO-WLCSP 180, similar to the structure described in FIGS. 3a-3f, with stress relief buffer 184 made thinner than semiconductor die 124. A metal stiffener or layer 182 is mounted over stress relief buffer 130 prior to depositing encapsulant 136. An adhesive layer is deposited over stress relief buffer 184 to secure stiffener 182. Stiffener 182 can be formed as a window completely around semiconductor die 124, as shown in FIG. 9b. Stiffener 182 reduces warpage in FO-WLCSP 180.

Figure 10A:
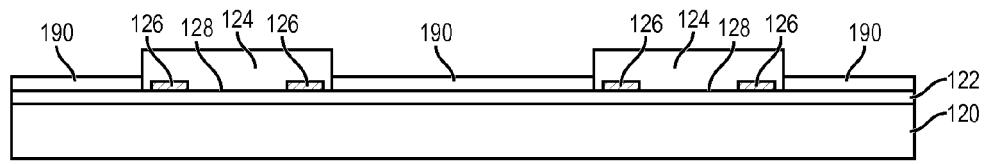
FIGS. 10a-10c illustrate a process of forming a compliant stress relief layer around a semiconductor die.
Figure 10B:
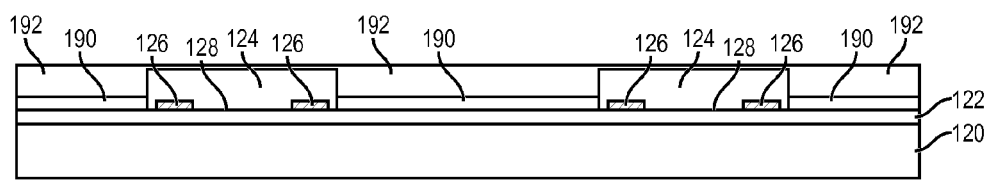
Figure 10C:
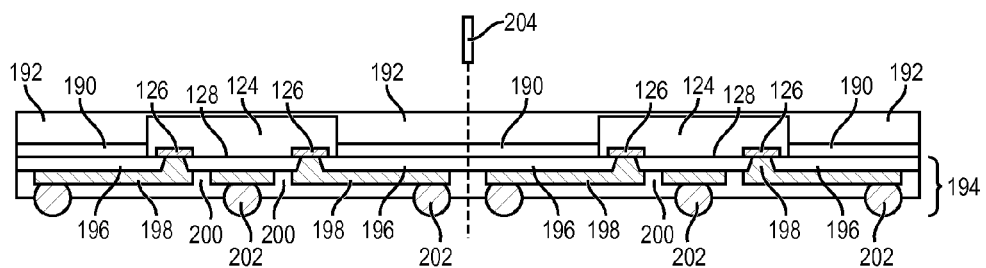

FIGS. 10a-10c illustrate, in relation to FIGS. 1 and 2a-2c, a process of forming a compliant stress relief layer around semiconductor die. Continuing with the structure described in FIG. 3a, a compliant stress relief layer 190 is formed over interface layer 122 around semiconductor die 124 using spray coating or screen printing. Stress relief layer 190 can be deposited prior to mounting semiconductor die 124. There may be a gap or there may be no gap between stress relief layer 190 and semiconductor die 124. In the case of a gap, an underfill material, such as epoxy or polymeric material, is applied over die edge to cover the gap to prevent die shifting during encapsulation. Stress relief layer 190 can be a compliant material, such as polymer, epoxy, polymeric material, epoxy resin with filler, epoxy acrylate with filler, photosensitive resist, or other compliant material having high elongation, low modulus, and balanced CTE. In one embodiment, stress relief layer 190 is an insulating material, such as polyimide, PBO, silicon base elastomer, or other similar material, with a low CTE (20 ppm/° C. or less) and low modulus (200 MPa or less). Stress relief layer 190 is typically 15-100 micrometers (μm) in thickness.

In FIG. 10b, an encapsulant or molding compound 192 is deposited over stress relief layer 190 and semiconductor die 124 using a paste printing, compressive molding, transfer molding, liquid encapsulant molding, vacuum lamination, spin coating, or other suitable applicator. Encapsulant 192 can be polymer composite material, such as epoxy resin with filler, epoxy acrylate with filler, or polymer with proper filler. Encapsulant 192 is non-conductive and environmentally protects the semiconductor device from external elements and contaminants.

In FIG. 10c, temporary carrier 120 and optional interface layer 122 are removed by chemical etching, mechanical peel-off, CMP, mechanical grinding, thermal bake, laser scanning, or wet stripping. A bottom-side build-up interconnect structure 194 is formed over semiconductor die 124 and stress relief layer 190. The build-up interconnect structure 194 includes an insulating or passivation layer 196 containing one or more layers of SiO2, Si3N4, SiON, Ta2O5, Al2O3, or other material having similar insulating and structural properties. The insulating layer 196 is formed using PVD, CVD, printing, spin coating, spray coating, sintering or thermal oxidation. A portion of insulating layer 196 is removed by an etching process to expose contact pads 126 of semiconductor die 124.

An electrically conductive layer 198 is formed over insulating layer 196 and contact pads 126 using a patterning and metal deposition process such as PVD, CVD, sputtering, electrolytic plating, and electroless plating. Conductive layer 198 can be one or more layers of Al, Cu, Sn, Ni, Au, Ag, or other suitable electrically conductive material. Conductive layer 198 operates as an RDL. One portion of conductive layer 198 is electrically connected to contact pads 126 of semiconductor die 124. Other portions of conductive layer 198 can be electrically common or electrically isolated depending on the design and function of the semiconductor device.

An insulating or passivation layer 200 is formed over insulating layer 196 and conductive layer 198 using PVD, CVD, printing, spin coating, spray coating, sintering or thermal oxidation. The insulating layer 200 can be one or more layers of SiO2, Si3N4, SiON, Ta2O5, Al2O3, or other material having similar insulating and structural properties. A portion of insulating layer 200 is removed by an etching process to expose conductive layer 198.

An electrically conductive bump material is deposited over build-up interconnect structure 194 and electrically connected to conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 202. In some applications, bumps 202 are reflowed a second time to improve electrical contact to conductive layer 198. The bumps can also be compression bonded to conductive layer 198. Bumps 202 represent one type of interconnect structure that can be formed over conductive layer 198. The interconnect structure can also use bond wires, stud bump, micro bump, or other electrical interconnect.

Figure 11A:
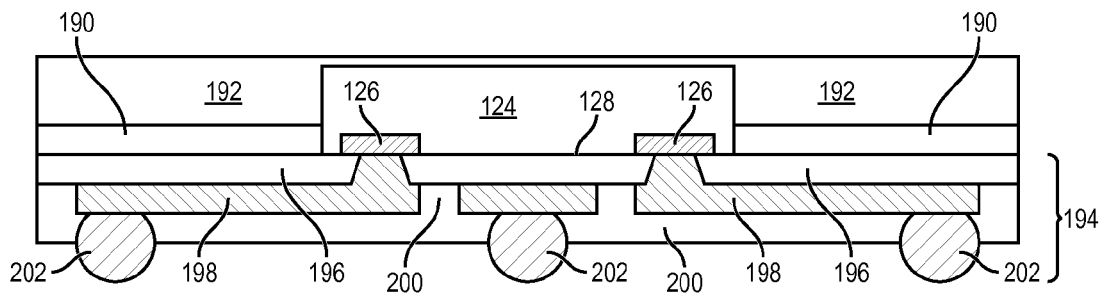
FIGS. 11a-11b illustrate the FO-WLCSP with the stress relief layer around the semiconductor die.
Figure 11B:
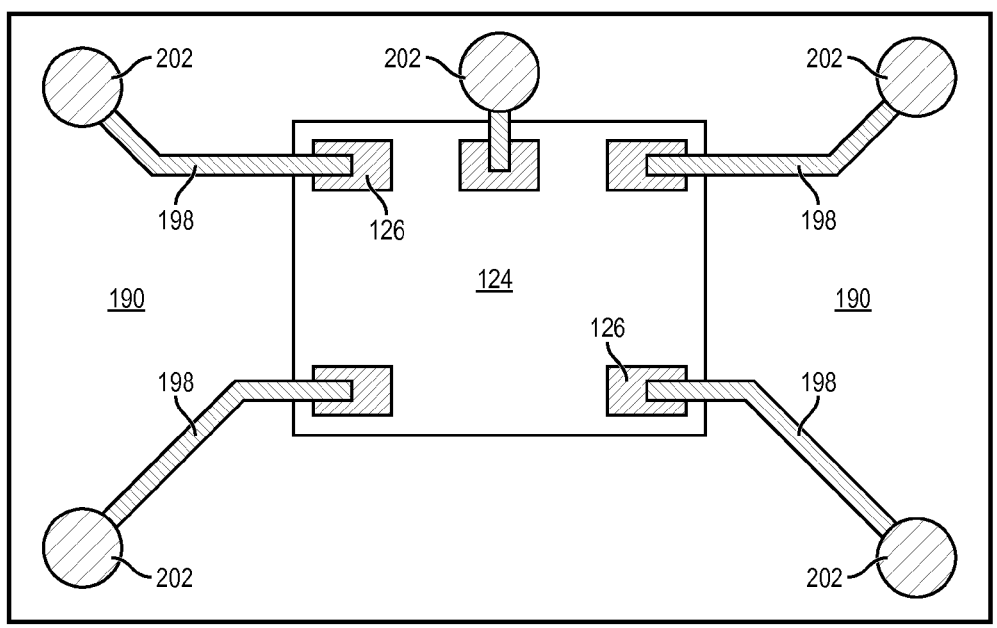

Semiconductor die 124 are singulated with saw blade or laser cutting device 204 into individual semiconductor devices. FIG. 11a shows a cross-sectional view of FO-WLCSP 206 after singulation. FIG. 11b shows a bottom view of semiconductor die 124 and stress relief layer 190 with contact pads 126 electrically connected to bumps 202 through conductive layer 198. The compliant stress relief layer 190 is disposed around semiconductor die 124 to prevent failure of bumps 202 during temperature cycling testing and other mechanical shock or impact of a reliability or drop test by absorbing thermo-mechanical stress. Stress relief layer 190 has a low Young's modulus, i.e., less than encapsulant 192, good elasticity and resiliency characteristics, and CTE similar to or slightly less than the encapsulant. Stress relief layer 190 also serves to reduce die shifting during the encapsulation process.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die or component including an electrical functionality and a mechanical functionality;
   disposing a stress relief buffer including a compliant material partially along a side of the semiconductor die or component;
   depositing an encapsulant over the semiconductor die or component and stress relief buffer; and
   singulating through the stress relief buffer to expose the stress relief buffer from a side surface of the semiconductor device.

2. The method of claim 1, further including forming a circuit layer within the stress relief buffer.

3. The method of claim 1, wherein the stress relief buffer protects the semiconductor die or component by absorbing thermo-mechanical stress.

4. The method of claim 1, wherein disposing the stress relief buffer further includes disposing the stress relief buffer in separate locations around the semiconductor die or component.

5. The method of claim 4, wherein depositing the encapsulant further includes depositing the encapsulant between the separate locations of the stress relief buffer.

6. The method of claim 1, wherein depositing the encapsulant further includes depositing the encapsulant over the stress relief buffer.

7. A method of making a semiconductor device, comprising:
   providing a semiconductor die or component including an electrical functionality and a mechanical functionality;
   pre-forming a stress relief buffer including a compliant material;
   disposing the pre-formed stress relief buffer along a side of the semiconductor die or component; and
   singulating through the pre-formed stress relief buffer to expose the pre-formed stress relief buffer from a side surface of the semiconductor device.

8. The method of claim 7, wherein pre-forming a stress relief buffer further includes forming a circuit layer within the compliant material.

9. The method of claim 7, wherein the pre-formed stress relief buffer protects the semiconductor die or component by absorbing thermo-mechanical stress.

10. The method of claim 7, wherein disposing the pre-formed stress relief buffer further includes disposing the pre-formed stress relief buffer in separate locations around the semiconductor die or component.

11. The method of claim 10, further including depositing an encapsulant between the separate locations of the pre-formed stress relief buffer.

12. The method of claim 7, further including depositing an encapsulant over the pre-formed stress relief buffer.

13. The method of claim 7, further including forming a plurality of bumps over the pre-formed stress relief buffer.

14. A semiconductor device, comprising:
    a semiconductor die or component including an electrical functionality and a mechanical functionality;
    a thermal interface material layer disposed directly over the semiconductor die or component;
    a multi-layered stress relief buffer including a first compliant layer, silicon layer, and second compliant layer, the multi-layered stress relief buffer disposed around the semiconductor die or component and coplanar with the thermal interface material layer;
    a stiffener disposed over the multi-layered stress relief buffer; and
    an encapsulant deposited around the semiconductor die or component and around the stress relief buffer.

15. The semiconductor device of claim 14, further including a circuit layer formed within the stress relief buffer.

16. The semiconductor device of claim 14, wherein the stiffener extends over both the multi-layered stress relief buffer and the thermal interface material layer.

17. The semiconductor device of claim 16, wherein the encapsulant is deposited between the separate locations of the stress relief buffer.

18. The semiconductor device of claim 14, wherein the encapsulant is deposited over the stress relief buffer.

19. The semiconductor device of claim 14, further including a plurality of bumps formed over the stress relief buffer.

20. A semiconductor device, comprising:
    a semiconductor die or component including an electrical functionality and a mechanical functionality, the semiconductor die or component having a thickness;
    a stress relief buffer including a compliant material disposed spaced apart from the semiconductor die or component, and;
    a stiffener layer deposited over the stress relief buffer, wherein the combined thickness of the stiffening layer and the stress relief buffer is thinner than the thickness of the semiconductor die or component.

21. The semiconductor device of claim 20, further including a circuit layer formed within the stress relief buffer.

22. The semiconductor device of claim 20, wherein the stress relief buffer is disposed in separate locations around the semiconductor die or component.

23. The semiconductor device of claim 22, further including an encapsulant deposited between the separate locations of the stress relief buffer.

24. The semiconductor device of claim 20, further including an encapsulant deposited over the stress relief buffer.

25. The semiconductor device of claim 20, further including a plurality of bumps formed over the stress relief buffer.

* * * * *